(12) United States Patent
Ware et al.

(10) Patent No.: US 11,146,269 B1
(45) Date of Patent: Oct. 12, 2021

(54) LOW POWER CRYOGENIC SWITCH

(71) Applicant: Rambus Inc., Sunnyvale, CA (US)

(72) Inventors: Frederick A. Ware, Los Altos Hills, CA (US); Carl W. Werner, Los Gatos, CA (US)

(73) Assignee: Rambus Inc., San Jose, CA (US)

(*) Notice: Subject to any disclaimer, the term of this patent is extended or adjusted under 35 U.S.C. 154(b) by 0 days.

(21) Appl. No.: 16/266,244

(22) Filed: Feb. 4, 2019

Related U.S. Application Data

(60) Provisional application No. 62/734,193, filed on Sep. 20, 2018, provisional application No. 62/626,676, filed on Feb. 5, 2018.

(51) Int. Cl.
| | |
|---|---|
| *H03K 17/92* | (2006.01) |
| *H03K 19/173* | (2006.01) |
| *G06F 1/26* | (2006.01) |
| *H03K 19/195* | (2006.01) |
| *F25D 29/00* | (2006.01) |

(52) U.S. Cl.
CPC ............ *H03K 17/92* (2013.01); *F25D 29/001* (2013.01); *G06F 1/263* (2013.01); *H03K 19/1733* (2013.01); *H03K 19/1952* (2013.01)

(58) Field of Classification Search
CPC ............... H03K 11/92; H03K 19/1733; H03K 19/1952; F25D 29/001; G06F 1/263
See application file for complete search history.

(56) References Cited

U.S. PATENT DOCUMENTS

| | | | | |
|---|---|---|---|---|
| 8,860,887 | B2* | 10/2014 | Nakajima | H04N 21/43635 348/725 |
| 9,159,743 | B2* | 10/2015 | Crandall | H01L 27/1211 |
| 9,368,053 | B2* | 6/2016 | Koyama | G09G 3/20 |
| 9,985,663 | B2* | 5/2018 | De Ranter | H04L 49/253 |
| 10,033,423 | B2* | 7/2018 | Reisner | H01L 25/0657 |
| 2006/0018329 | A1* | 1/2006 | Nielsen | H04L 47/52 370/401 |
| 2008/0165794 | A1* | 7/2008 | Sutardja | H03K 17/693 370/420 |

* cited by examiner

*Primary Examiner* — Dinh T Le
(74) *Attorney, Agent, or Firm* — Charles Shemwell

(57) ABSTRACT

An signal switching integrated-circuit die includes an array of switch cells, control signal contacts, data input contacts and data output contacts. Switch control signals are received from an external control-signal source via respective control signal contacts, inbound data signals are received from one or more external data-signal sources via respective data input contacts and outbound data signals are conveyed to one or more external data-signal destinations via respective data output contacts. The array of switch cells receives the control signals directly from the control signal contacts and response to the control signals by switchably interconnecting the data input contacts with selected ones of the data output contacts.

11 Claims, 6 Drawing Sheets

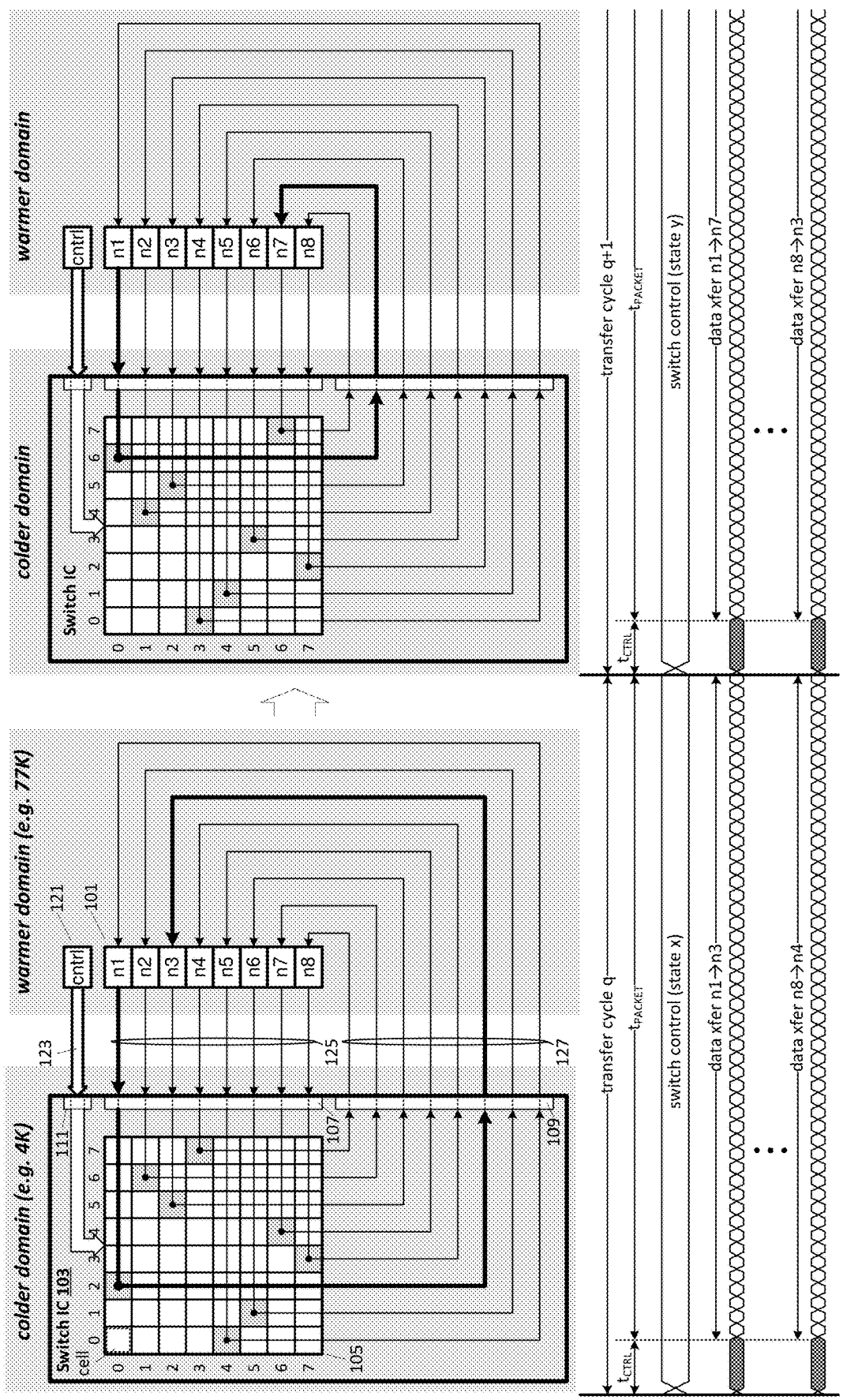
FIG. 1  Remotely Controlled CryoSwitch

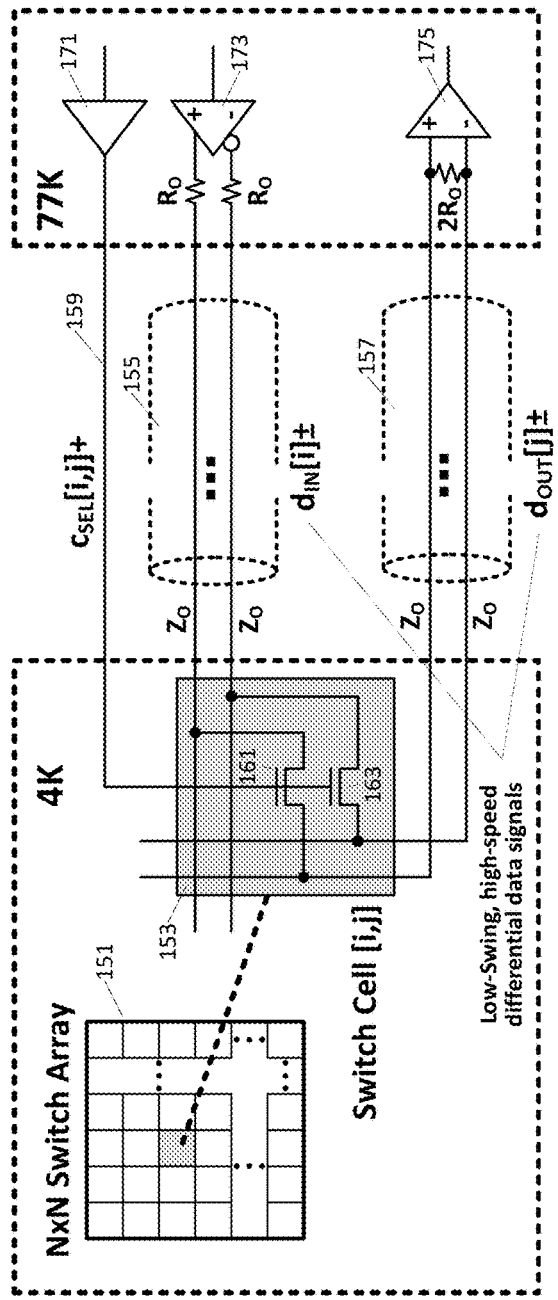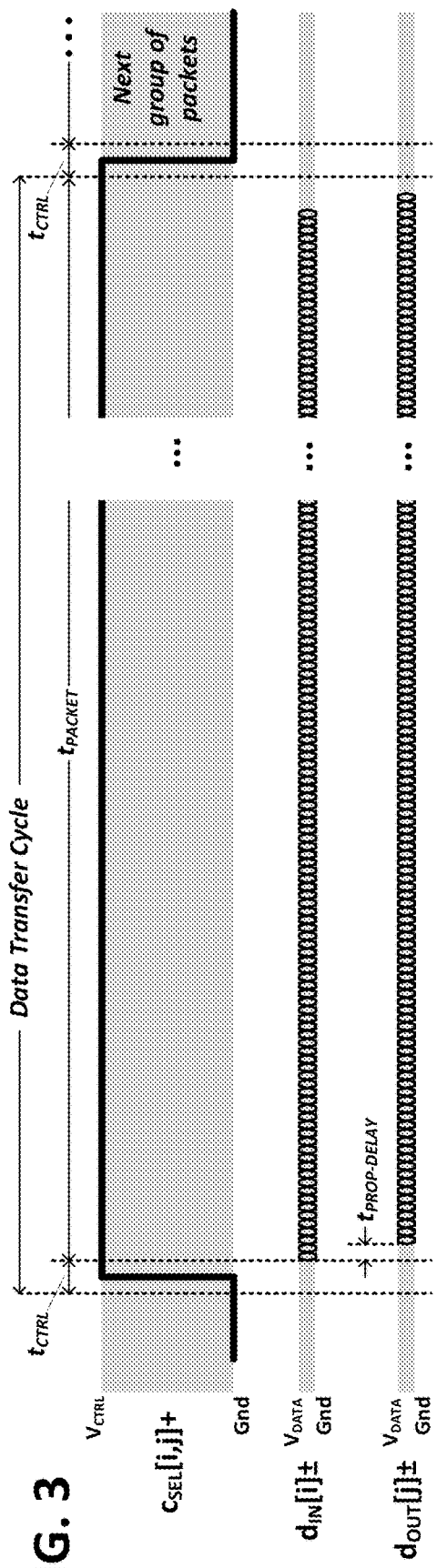
FIG. 2  NxN CryoSwitch with $N^2$ select control inputs
FIG. 3

NxN CryoSwitch with 2N select control inputs

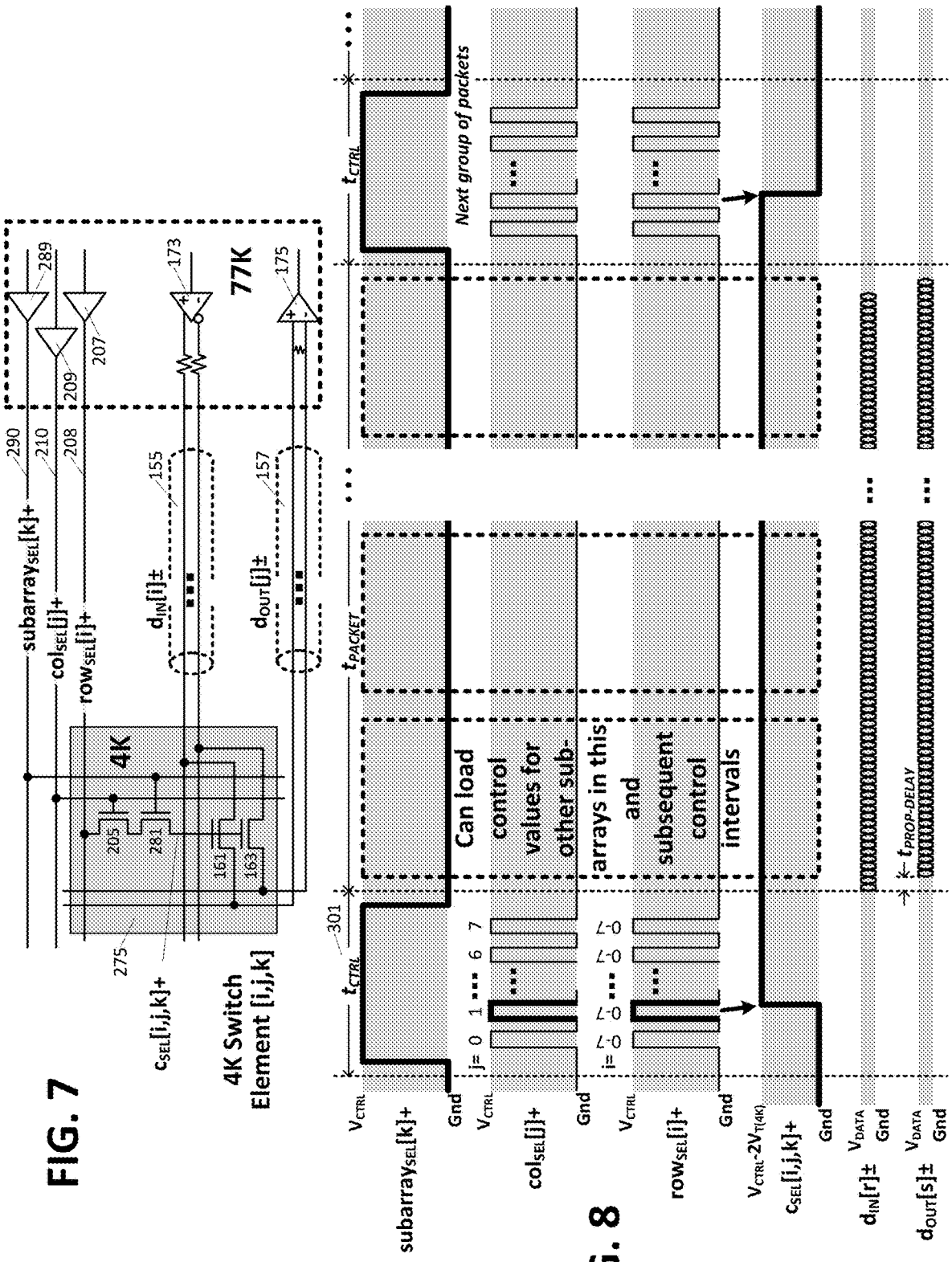

… (1) …

LOW POWER CRYOGENIC SWITCH

CROSS REFERENCE TO RELATED APPLICATIONS

This application hereby claims priority to U.S. provisional application No. 62/734,193 filed Sep. 20, 2018 and U.S. provisional application No. 62/626,676 filed Feb. 5, 2018. Each patent application referenced in this paragraph is hereby incorporated by reference.

TECHNICAL FIELD

The present disclosure relates generally to data processing and more particularly to low power data transfer within or between integrated circuit devices.

DRAWINGS

The various embodiments disclosed herein are illustrated by way of example, and not by way of limitation, in the figures of the accompanying drawings and in which like reference numerals refer to similar elements and in which:

FIG. 1 illustrates a dual-temperature data processing environment in which data is transferred between respective pairs of data input/output nodes disposed in a relatively warm temperature domain via an integrated-circuit switch disposed in a colder, superconducting temperature domain;

FIG. 2 illustrates an embodiment of a remotely-controlled cryogenic switch referred to herein as a "non-indexed" switch due to the provision of a dedicated configuration control input per switching element;

FIG. 3 illustrates an exemplary select signal and data signal waveforms during a data transfer cycle within the FIG. 2 switch;

FIG. 7 illustrates an exemplary implementation of a switch cell that may be deployed within the triple-indexed switch array of FIG. 6 together with remotely located select-signal drivers and data signal driver and receiver;

Figure 4:
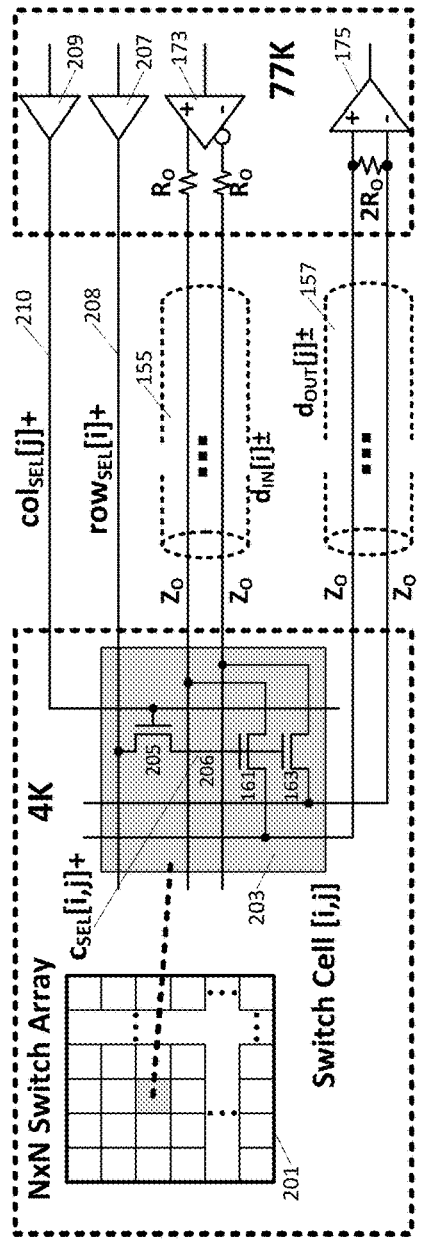
FIG. 4 illustrates an embodiment of a remotely-controlled cryogenic switch that is configured by a substantially reduced number of cell select signals relative to the embodiment of FIG. 2, significantly reducing interdomain thermal transfer and thus total power consumption.
Figure 9:
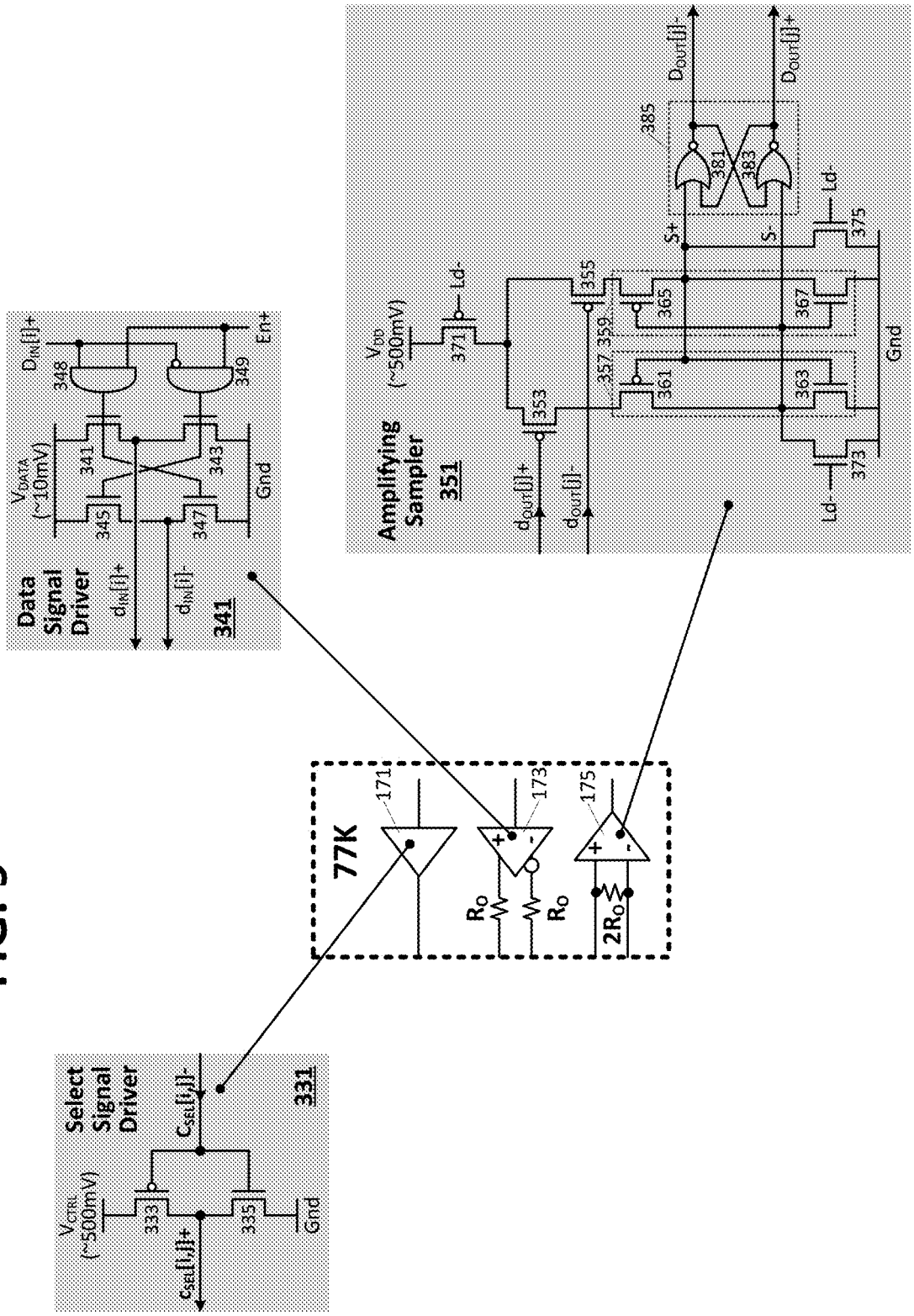

FIG. 8 illustrates exemplary waveforms for switch configuration and data transfer with respect to a given subarray within a triple-indexed switch having a per-cell implementation as shown at in FIG. 7; and FIG. 9 illustrates embodiments of signal driver/receiver circuitry that may be used to implement the control/select signal drivers, data signal driver and data signal receiver illustrated in FIGS. 2, 4 and 7.

DETAILED DESCRIPTION

An integrated circuit die having switching circuitry that steers data signals from a plurality of input nodes to a plurality of output nodes in accordance with configuration control signals received from an off-die switch-control source is disclosed herein in various embodiments. The switching circuitry is implemented by metal-oxide semiconductor (MOS) devices directly connected to data and control signal interconnect pads of the integrated circuit die in a number of embodiments (i.e., so that control signals are conveyed to the switching circuitry, and data signals conveyed thereto and from, without passing through buffering, amplification or other active circuitry on the integrated circuit die) limiting power dissipation in a given data signal steering/switching operation principally to data signal flow through control-signal-enabled MOS devices. Further, in a number embodiments, the integrated circuit die (referred to herein as the switch die or switch chip) is designed for operation within a superconducting cryogenic environment (e.g., below approximately 10 Kelvin ("10K") and more specifically below the ~5K boiling point of liquid Helium), while the switch-control source and data signal sources/destinations are disposed in a warmer though potentially still cryogenic environment (e.g., at or near the 77 K boiling point of liquid Nitrogen)—an arrangement that leverages the negligible leakage and exceedingly low threshold voltage of MOS devices at superconducting temperature to enable switched data transfer between warmer-domain source and destination nodes with dramatically reduced power dissipation relative to an equivalent switching operation effected entirely within the warmer temperature domain. Also, in a number of embodiments, the configuration control signals and data signals are generated with relatively high and relatively low voltage swings, enabling pass-configured MOS devices within the switching circuitry to be highly overdriven (e.g., configuration control signal amplitude 100× the MOS device threshold voltage at superconducting temperature, though higher- or lower-amplitude control signals may be generated) while limiting data signal current flowing source-to-drain through the MOS devices. In those embodiments, disposition of the configuration control signal source in the warmer domain (remotely from the switch IC) dramatically lowers the cooling power required to dissipate the heat attendant to large-swing signal generation.

FIG. 1 illustrates a dual-temperature data processing environment in which data is transferred between respective pairs of data input/output (I/O) nodes 101 disposed in a relatively warm (~77K) temperature domain via a switch IC 103 disposed in a colder, superconducting (~4K) temperature domain. In the depicted embodiment, switch IC 103 includes switching circuit 105 (also referred to herein as the "switch" or "switch fabric") together with inbound and output data interfaces 107, 109 and a configuration-control interface 111, the latter delivering configuration control signals to switch 105 to establish interconnections therein between individual link connection points within the inbound and outbound data interfaces. Because of its intended operating environment (i.e., superconducting temperature domain) and receipt of configuration control signals from a remote source, switching circuit 105 is referred to herein as a remotely-controlled cryogenic switch.

In the FIG. 1 embodiment, data is transferred between 77K I/O nodes (i.e., via switching circuit 105) in a sequence of transfer cycles (q, q+1, q+2, etc.), each of which transpires in two phases: a switch control (or configuration) phase followed by a data transmission (or burst) phase. During the switch control phase, configuration control source 121 within the 77K domain outputs control signals to switch IC 103 via control lines 123 to switchably interconnect selected I/O nodes 101 (i.e., nodes "n1," "n2," etc.) via switching circuit 105. More specifically, as detailed below, configuration control signals arriving at signal pads of interface 111 via control lines 123 are conducted directly to gates of MOS transistors within switching circuit 105 (i.e., no intermediate buffering, amplifying or other active circuitry) to establish a set of parallel signal conduction paths therein, each path interconnecting a respective "source" node (one of I/O nodes 101) and "destination" node (another one of I/O nodes 101) to enable parallel data transmission from each of the 'N' I/O nodes (N=8 in this example) to selected others of the I/O nodes.

To provide full interconnect flexibility between I/O nodes 101, switch circuit 105 provides includes N switch cells (or switch elements) for each of the N I/O nodes and thus N×N switch elements in all (8×8=64 switch cells in the specific example shown). During a given transfer cycle as many as N of those switch cells are rendered to a signal conducting "active" or "activated" state (one switch cell in each row, with the activated switch cells in respective rows each disposed in a column unique from those in other rows) to establish N parallel data transfer paths between inbound data links 125 and outbound data links 127, while the remaining switch elements are held in (or transitioned to) a nonconducting "inactive" or "deactivated" state. This operation is indicated in FIG. 1 by depiction of active and inactive cells with and without shading, respectively, for two different transfer cycles, q and q+1. More specifically, configuration control signals delivered to switching circuit 105 at the start of transfer cycle q establishes a first switch configuration ("state x") in which the switch cell in row 0, column 2 (i.e., i=0, j=2, expressed as "(0,2)") interconnects one or more signal drivers within node n1 with a like number of signal receivers in node n3; switch cell (1,6) couples node n2 driver(s) with node 7 receiver(s); and so forth to the coupling of node n8 driver(s) to node n4 receiver(s) via switch cell (7,3). At the start of transfer cycle q+1 a new configuration control value is output to switch IC 103 to reconfigure input/output interconnections within switch circuitry 105 such that node n1 driver(s) are coupled to node n7 receivers, node n2 drivers are coupled to node n5 receivers etc.

For purposes of example going forward, each of the I/O nodes 101 is assumed to include a single data signal driver and a single data signal receiver so that each switching element (switch cell) within switch circuit 105 interconnects a single one of source signal links 125 (i.e., link conveying a data signal from source node to switch circuit) to a single one of destination signal links 127 (i.e., link conveying the data signal from switch circuit to destination node). In all cases, each I/O node may drive multiple data signals in parallel on respective data source links that are switchably coupled (via a given switch element within switch 105) to a corresponding number of data destination links for parallel reception within a multiple-data-signal receiver. Also, the data burst on each source or destination link during a given transfer cycle is constituted by serial stream of bits collectively referred to herein as a data packet—a stream of bits that may have any length (e.g., $2^{10}$ bits or more bits or less, or even a length according to one-time or run-time programmable setting), may convey any type of information (e.g., addressing information, control information, data per se, timing information, etc.) and may have any type of logical organization (e.g., packet header/tail of various sizes, payload of various size, etc.). Also, while I/O nodes 101 are depicted in FIG. 1 as both sourcing and receiving data during a given transfer cycle, the set of data source nodes and data destination nodes may include one or more mutually exclusive nodes. For example, any one or more nodes coupled to switch IC 103 may be a data destination node only (not sourcing or outputting data to switch circuit 105) or a data source node only (not receiving data from switch circuit 105). Further, while switch circuit embodiments herein are generally depicted and described as having symmetrically sized input and output ports (i.e., N inputs and N outputs and thus N×N switch cells), asymmetric N×M embodiments may be implemented in all cases (e.g., such that the number of possible number of destination nodes exceeds the number of source nodes (i.e., M>N). Also, each of the I/O nodes 101 (including destination-only or source-only nodes) may be implemented in a respective integrated circuit die (packaged separately from or with IC dies containing one or more others of the I/O nodes), or groups of two or more (or even all) I/O nodes may be collocated on the same integrated circuit die. Moreover, despite depiction in FIG. 1 and embodiments discussed below as being disposed the same "warmer" temperature domain (e.g., 77K), any of the source or destination nodes may be disposed in temperature domains warmer or colder than 77K, including disposition within a room-temperature domain or a superconducting domain.

FIG. 2 illustrates an embodiment of a remotely-controlled cryogenic switch referred to herein as a "non-indexed" switch due to the provision of a dedicated configuration control input per switching element. That is, each of the N×N switch elements or "cells" within switch circuit 151—also referred to as a "switch array"—receives (via a control interface not shown) a respective configuration control signal so that $N^2$ control signals are conducted via respective chip-to-chip signal lines (also $N^2$ in quantity) from a 77K-domain remote configuration control source to switch array 151 and thus from a relatively warm (77K) temperature domain to a relatively cold (4K) temperature domain. Those configuration control signals, also referred to herein as cell-select signals, $c_{SEL}$ (or simply "select" signals) are distinguished by respective switch-array positions—row and column indices—of the switch cells they control. Thus, $c_{SEL}[i,j]+$ refers to a cell-select signal that establishes the state, active or inactive, of the switch cell at row 'i' and column T of switch array 151 (i.e., switch cell [i,j]) during a given data transfer cycle (the '+' suffix indicating an active-high signal assertion state, in contradistinction to the active-low assertion state indicated by a '-' suffix, a convention applied with respect to a number of signals herein). More specifically, in the depicted implementation of switch cell [i,j], at 153, a differential signaling link 157 conveying inbound row 'i' data signal $d_{IN}[i]±$, is switchably coupled to or decoupled from column 'j' outbound differential signaling link 157 via NMOS (N-type MOS) transistors 161 and 163 according to whether select signal $c_{SEL}[i,j]+$ is asserted (driven high) or deasserted (driven low). In the former case (cSEL[i,j] asserted), transistors 161 and 163 are switched to a conducting state, activating switch cell [i,j] so that data signal $d_{IN}[i+]$ conveyed on the row 'i' inbound link 155 is conducted from drain to source through transistors 161 and 163 to become outbound data signal $d_{OUT}[j+]$ on the column 'j' outbound link 157.

Still referring to FIG. 2, select signal driver 171 within the 77K domain (one of $N^2$ such signal drivers) generates a relatively high-swing cell-select signal (i.e., large voltage transition between asserted and deasserted states) that strongly overdrives the gates of NMOS switching transistors 161 and 163, thereby enabling substantially increased drain-to-source current through those transistors and thus substantially faster data signal propagation through switch cell 153. By contrast, differential data signal driver 173 (one of N) and differential data signal receiver 175 (also one of N) generate and receive relatively low-swing signals that may be rapidly switched between high and low signal levels and thus permit high data signaling rates (i.e., brief interval per bit or $t_{BIT}$). In a number of embodiments, for example, select signal driver 171 asserts cell-select signals at a voltage approximately 100 times the ~5 mV threshold voltage exhibited by NMOS transistors 161, 163 at 4K (i.e., $c_{SEL}$[i,j]± switched between ground and a ~500 mV control voltage supply), while differential data signal driver 173 switches $d_{IN}$[i]± (and thus $d_{OUT}$[j]±) between ground and ~10 mV (ten millivolts). From a power perspective, the high impedance loads presented by the gates of switching transistors 161 and 163 and the exceedingly low leakage and high transconductance of those transistors at 4K ensures that exceedingly little power is dissipated within switch 153 itself. Instead, virtually all configuration control power is dissipated within select-signal drivers 171 (in the 77K domain where the power dissipation penalty is dramatically lower) and data-drive and data sampling power is likewise consumed primarily within the 77K-domain data signal drivers and receivers (173, 175). In the embodiment shown, each differential link is modeled as a transmission line having a characteristic per-line impedance Zo that is matched by source-series impedances $R_O$ at the output of differential data driver 173 and matched by a impedance $2R_O$ coupled between the input nodes of differential data receiver 175. Other impedance matching arrangements may be implemented in alternative embodiments.

FIG. 3 illustrates an exemplary select signal and data signal waveforms during a data transfer cycle within the FIG. 2 switch. As shown, the cell select signal delivered to switch cell 153 ($c_{SEL}$[i,j]) is raised (asserted) during a control phase ($t_{CTRL}$) of the subject data transfer cycle, followed by arrival of inbound data burst $d_{IN}$[i]± at the start of the data transfer phase and then, after a switch propagation delay, output of outbound data burst $d_{OUT}$[j]±. As shown, select signal $c_{SEL}$[i,j] is held in the asserted state throughout the data transfer phase ($t_{PACKET}$), spanning both inbound data arrival and outbound data departure, to maintain transistors 161 and 163 in a signal conduction (signal-pass) state. Also, though not specifically to scale, the select signal swing (between ground and $V_{CTRL}$) is depicted as substantially greater than the data signal swing (between ground and $V_{DATA}$) to emphasize the relatively low-speed/high-swing and high-speed/low-swing characteristics of those signals.

Returning briefly to FIG. 2, each of the select signal lines 159 (e.g., copper traces over a substrate, flex cable or other signal conduction structure) constitutes a thermal propagation path between the 77K and 4K domains, meaning that the relatively high number of those lines in the non-indexed switch embodiment (i.e., one per switch cell and thus $N^2$ lines) presents a substantial thermal intrusion path into the 4K domain. In embodiments presented below, the number of select-signal lines is substantially reduced through indexed switch cell activation, expending some additional power within the cryogenic switch itself (i.e., to activate selected cells) in return for substantially attenuated thermal loss path and thus effecting an overall power savings.

FIG. 4 illustrates an embodiment of a remotely-controlled cryogenic switch that receives (and is configured by) a substantially reduced number of cell select signals relative to the $N^2$ embodiment of FIG. 2, significantly reducing inter-domain thermal transfer and thus total power consumption. More specifically, N×N switch array 201 (disposed in a 4K temperature domain) receives two sets of select signals: a set of N row-indexed select signals ($row_{SEL}$[i]+ from signal drivers 207 via select lines 208, where i is the row index and ranges from 0 to N-1) coupled to constituent cells of respective rows, and a set of N column-indexed select signals ($col_{SEL}$[j]+ from signal drivers 209 via select lines 210, where j is the column index and also ranges from 0 to N-1) coupled to constituent cells of respective columns. In this arrangement, each switch cell 203 within array 201 is coupled to and activated by a unique row/column select-signal pair. In the embodiment of FIG. 4, this "indexed" cell selection is enabled by control-side (77K) row/column select signal encoding and switch-side (4K) provision of an additional "cell-select transistor" 205 within each switch cell. As shown in cell 203, cell-select transistor 205 is coupled drain-to-source between the row-select line 210 for the subject cell and the gate terminals of pass-configured transistors 161 and 163, with the gate terminal of cell-select transistor 205 coupled to column-select line for the cell. More specifically, within the switch cell at array row 'i' and array column 'j' (i.e., switch cell [i,j]), the drain terminal of cell-select transistor 205 is coupled to receive $row_{SEL}$[i]+ and the gate terminal of cell-select transistor 205 is coupled to $col_{SEL}$[j]+, an arrangement that effects a logical AND of those two signals at cell selection node 206 (i.e., $c_{SEL}$[i,j], the gate terminals of transistors 161 and 163) so that a given cell is only activated when both the row-select and column-select signals corresponding to that cell are asserted. Note that connection of cell-select signal 205 with respect to row and column select lines (208 and 210) may be reversed in alternative embodiments.

To enable concurrent interconnection between N inbound data links and N outbound data links through switch array 201, it is necessary to establish a logic high potential at the cell selection nodes 206 of N different switch cells (i.e., Vgs>$V_T$ for transistors 161 and 163 within each of those switch cells), one in each row and one in each column. In one embodiment, this N-cell activation is achieved during the control phase of each data transfer cycle through pulsed assertion of each of the N column-select signals one after another in respective cell-activation sub-intervals, with selective assertion of one of the N row-select signals during each sub-interval. For example, to activate switch element [i,j], then during the sub-interval allocated to cell column j (while $col_{SEL}$[j]+ is asserted), row-select signal [i] is asserted. By this operation, the assertion of $col_{SEL}$[j]+ will turn on (i.e., render to a drain-to-source conducting state) cell-select transistors 205 within each of the N switch cells in column 'j' of the switch array, while the selective assertion of $row_{SEL}$[i]+ (i.e., driving $row_{SEL}$[i]+ high and driving all other row select signals low) will drive cell-select node $c_{SEL}$[i,j]+ high (activating the switch cell in column T and row 'i' by switching on transistors 161 and 163 within that cell to interconnect link $d_{IN}$[i] and $d_{OUT}$[j]) while discharging (driving low) all other cell-select nodes in that column of cells (i.e., disabling signal conduction through those switch cells). After activating a selected cell within a given column, the column select signal for that column is deasserted, effectively trapping charge within the cell-select node of the activated cell for the remainder of the data transfer cycle (i.e., in view of the vanishingly small NMOS transistor leakage at 4K) and until that same column select signal is reasserted during the control phase of the subsequent data transfer cycle.

Figure 5:
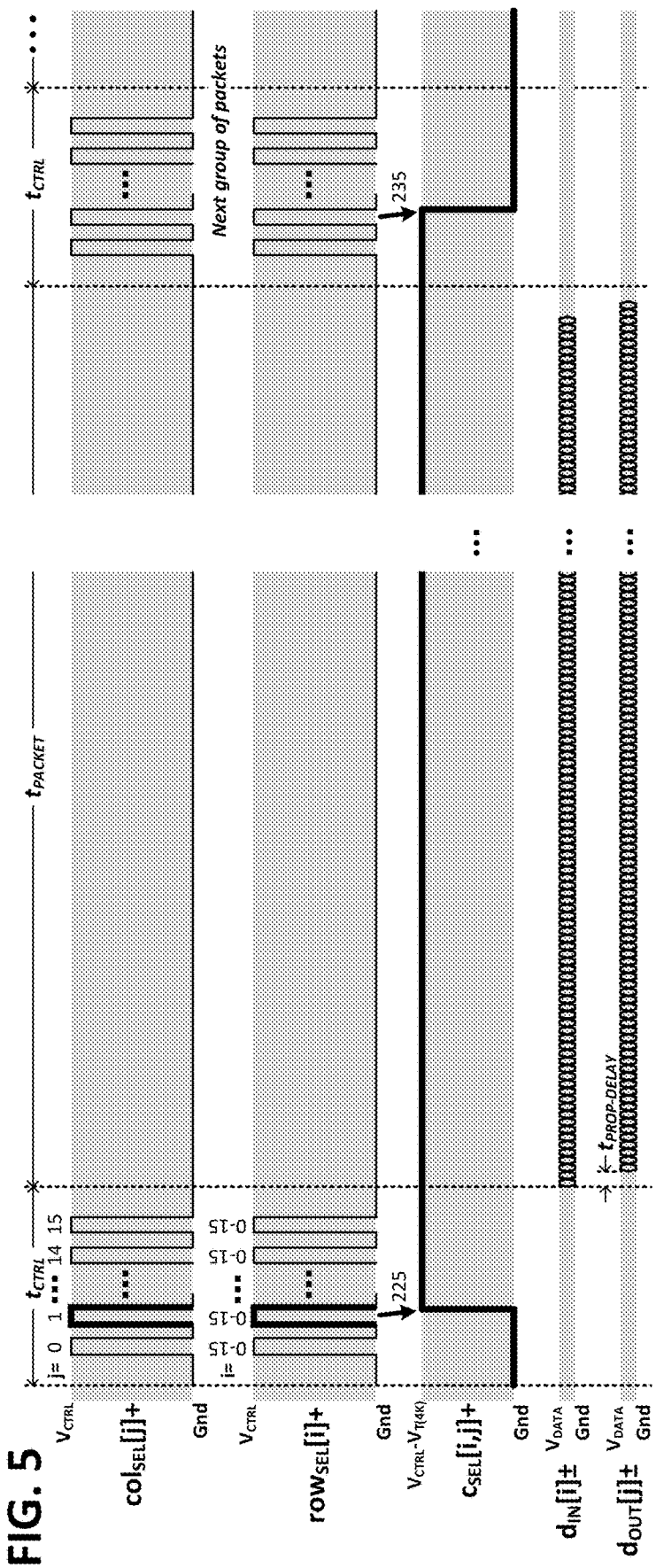
FIG. 5 illustrates signal waveforms for exemplary switch configuration and data-transfer phases of a data transfer cycle within the row/column-indexed switch array of FIG. 4.

FIG. 5 illustrates signal waveforms for exemplary switch configuration and data-transfer phases of a data transfer cycle within the row/column-indexed switch array of FIG. 4. As shown, column-select pulses are driven onto each of the N column select lines 210 in succession during respective sub-intervals (enumerated 0-15 for an exemplary N×N switch array in which N=16). More specifically, $col_{SEL}$[0]+ is pulsed during a first sub-interval, $col_{SEL}$[1]+ is pulsed during a second sub-interval and so forth, such that a select-pulse is conveyed on each of the N column select lines during a respective sub-interval. During each sub-interval and thus concurrently with each column-select signal pulse, a row-select pulse is generated on a selected ("$i^{th}$") one of the N row select lines 208, thereby activating a single switch cell at location 'i' within the selected column T or cell [i,j] during that sub-interval. Note that the col$_{SEL}$[j]+ and row$_{SEL}$[i]+ waveforms are depicted in FIG. 5 as singular signals for compactness—each of the pulses shown for the col$_{SEL}$[j]+ waveform occurs on a respective one of N column-select lines 210 (time-staggered pulses on respective signal lines), and each of the pulses shown for the row$_{SEL}$[i]+ waveform likewise occurs on a respective one of N row-select lines 208.

Continuing with FIG. 5 and referring specifically to the concurrent column-select and row-select pulses during the second sub-interval (i.e., sub-interval for column 1 (j=1)), a row-select pulse on row-select line 'i' (e.g., row-select index i=0-15, excepting the row-select index applied for column 0) will drive the cell-select node high for switch cell [i,j] as shown at 225, and more specifically to the control voltage rail minus a threshold voltage drop across the cell-select transistor at 4K (i.e., $V_{CTRL}-V_{T(4K)}$). At the conclusion of the column 1 (j=1) sub-interval, col$_{SEL}$[j]+ and row$_{SEL}$[i]+ are both lowered (with column-select being lowered concurrently with or sufficiently before row-select to avoid a race condition with respect to cell-select node c$_{SEL}$[i,j]) to isolate the $V_{CTRL}-V_{T(4K)}$ charge level at cell-select node c$_{SEL}$[i,j]—a charge level that is held (due to negligible transistor leakage at 4K) through the remainder of the data transfer cycle until the configuration control phase of the subsequent cycle. At that point, assertion of the column select signal for column 1 followed by assertion of a new (different) row select signal (i.e., that the row-select signal asserted during the preceding configuration control phase) will be low, driving c$_{SEL}$[i,j] low as shown at 235.

Referring to both FIGS. 4 and 5, the row/column indexed cell selection reduces the number of select signal lines from $N^2$ to 2N and thus by a factor of N/2. Taking a switch array having 16 rows and 16 columns of switch cells (i.e., a "16×16" switch array) as an example, the total number of control lines would be reduced from 256 in a non-indexed switch array (i.e., one per switch cell) to 32 in a row/column-indexed implementation; a dramatic wire-count reduction that substantially reduces thermal incursion at the cost of slightly increased cell-selection power and cell activation time (e.g., relatively small power dissipation with respect to cell-select transistor 205). The power savings becomes more pronounced with increased switch array dimension.

Figure 6:
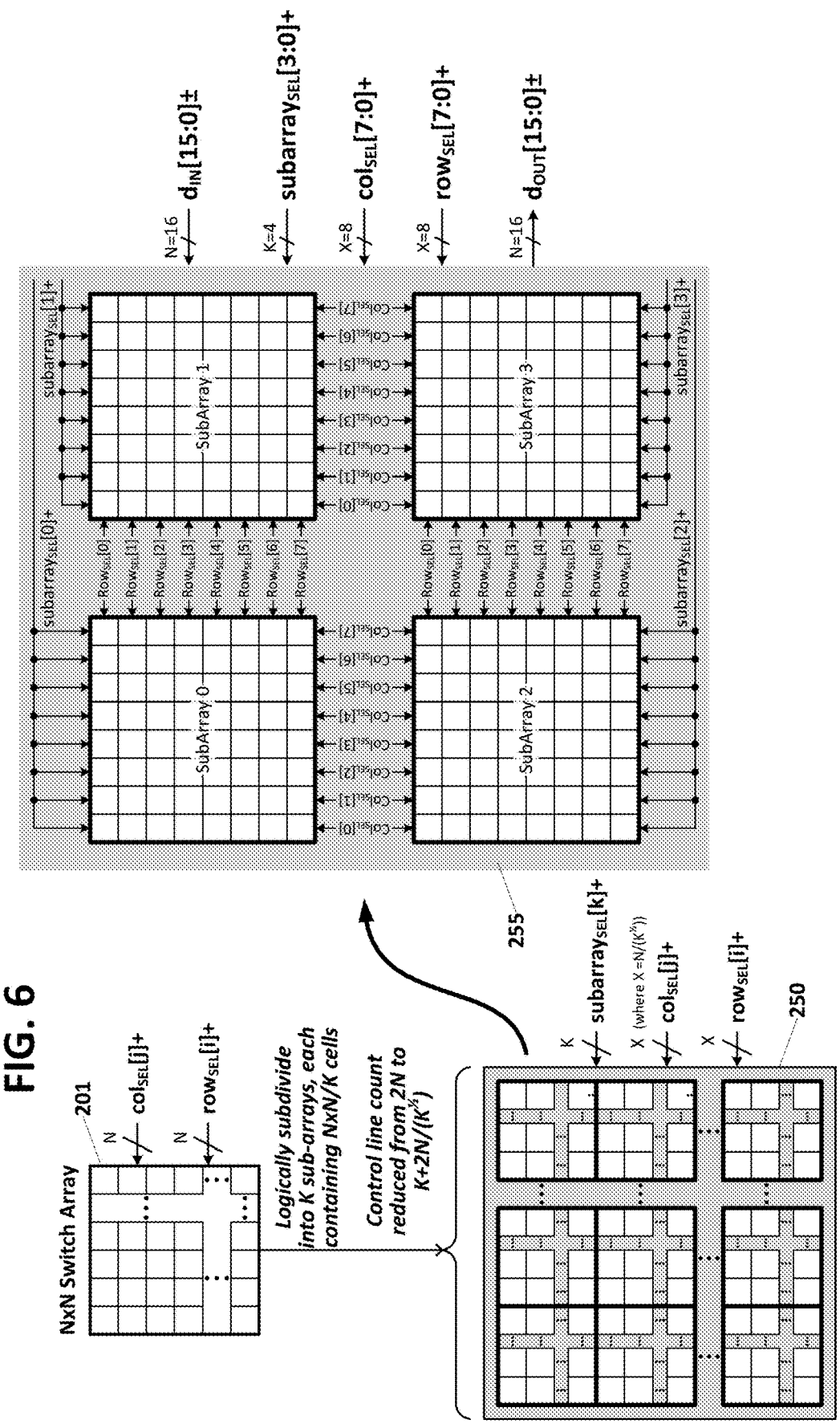
FIG. 6 illustrates another embodiment of a remotely controlled switch IC, in this case having a triple-indexed switch array.

FIG. 6 illustrates another embodiment of a remotely controlled switch IC, in this case having a triple-indexed switch array. More specifically, additional cell-select circuitry is added within switch cells of a row/column-indexed N×N switch array 201 (i.e., as shown in FIG. 4) to logically subdivide the switch array into K subarrays as shown at 250. In embodiments where the individual subarrays have the same aspect ratio as the switch array as a whole (e.g., equal number of rows and columns) or are otherwise uniformly sized, each sub-array will have N×N/K switch cells that may be selected for configuration, as a group, by a respective subarray-select signal. Further, by asserting each of the K subarray-select signals in succession, it becomes possible to configure switched interconnections within each subarray using a shared set of row/column-select lines—that is X=N/($K^{1/2}$) row-select lines and X column-select lines (i.e., 2X=2N/($K^{1/2}$) row/column select lines in total) all coupled in common to the K subarrays. Thus, as shown with respect to switch array 250, the total number of control signal lines in a triple-indexed N×N switch array having subarrays of like aspect to the switch array as a whole is K+2N/($K^{1/2}$); K subarray-select lines plus N/($K^{1/2}$) column-select lines plus N/($K^{1/2}$) row-select lines. Taking the 16×16 switch array discussed above as an example, and assuming subdivision into four subarrays (K=4), the total number of control signal lines becomes 4+2*16/($4^{1/2}$)=20, as contrasted with the 2N=32 control lines in a doubly-indexed (row/column-indexed) switch embodiment or 256 control lines in a non-indexed switch embodiment. Detail view 255 illustrates the control signal breakdown and application to four 8×8 subarrays in such an embodiment. More generally, for a triple-indexed switch array having Q cells, the total number of control signals (and control lines) required to configure the switch array is less than twice the square-root of Q.

FIG. 7 illustrates an exemplary implementation of a switch cell 275 that may be deployed within the triple-indexed switch array (250) of FIG. 6 together with remotely located select-signal drivers (207, 209 and 289) and data signal driver and receiver (173, 175), each of the latter being one of N. As shown, switch cell 275 includes the same pass-configured transistors 161 and 163 and column-select transistor 205 as the dual-index switch-cell of FIG. 4 together with a "subarray-select" transistor 281. While column-select transistor 205 is coupled to column-select line 210 (col$_{SEL}$[j]+) in common with constituent column-select transistors of all switch cells in the same column (i.e., column T), sub-array select transistor 281 is coupled to the subarray-select line (subarray$_{SEL}$[k]+) in common with constituent subarray-select transistors of all switch cells in the same subarray (i.e., subarray 'k') and thus to switch cells in multiple rows and columns. This arrangement is visible, for example, in the four-subarray triple-indexed switch array shown at 255 in FIG. 6.

FIG. 8 illustrates exemplary waveforms for switch configuration and data transfer with respect to a given subarray within a triple-indexed switch having a per-cell implementation as shown at 275 in FIG. 7. In the depicted example, subarray data transfer is pipelined with (i) individual subarrays being selected (by assertion of respective subarray-select signals) for row/column-indexed cell activation during respective and successive control intervals (t$_{CTRL}$), and (ii) data transfer through a respective subarray occurring concurrently with switch configuration within another subarray. Thus, in an initial control interval 301, the subarray-select signal for the $k^{th}$ subarray is asserted for an interval that spans the row/column activation pulse streams (carried out generally as described in reference to FIGS. 4 and 5) for the cells of that subarray, and then, in a subsequent control interval, the subarray-select signal for the $k+1^{th}$ subarray is asserted to enable switch cell configuration therein and so forth. Referring specifically to the $k^{th}$ subarray, the assertion of subarray-select signal k, column-select signal j and row-select signal i charges the cell-select node of switch cell [i,j] within the $k^{th}$ subarray (i.e., to $V_{CTRL}-2V_{T(4K)}$) and thus activates cell [i,j,k] within the switch array as a whole. In the depicted embodiment, data transfer via the $k^{th}$ subarray commences after the corresponding configuration/control interval (301), with data being switchably routed from one of the N/($K^{1/2}$) inbound data links coupled to the subject subarray to one of the N/($K^{1/2}$) outbound data links coupled to that same subarray. In the 16×16 switch array with four subarrays as shown in FIG. 6, for example, inbound data links $d_{IN}[15:0]+$ are switchably coupled to outbound data links $d_{OUT}[15:0]+$ as follows with respect to the K=4 subarrays:

$d_{IN}[7:0]+$ switchably coupled to $d_{OUT}[7:0]+$ via subarray 0

$d_{IN}[7:0]+$ switchably coupled to $d_{OUT}[8:15]+$ via subarray 1

$d_{IN}[8:15]+$ switchably coupled to $d_{OUT}[7:0]+$ via subarray 0

$d_{IN}[8:15]+$ switchably coupled to $d_{OUT}[8:15]+$ via subarray 0

Reflecting on this operation, it will be appreciated that, for full switch throughput, a total of 16(N) switch elements may be activated concurrently within the switch array as a whole, with a maximum of 8 (i.e., $N/(K^{1/2})$) of those switch elements being simultaneously activated within a given subarray. Accordingly, in a switch activation pattern maximally distributed with respect to the four subarrays, four switch elements are activated within each 8×8 subarray, and in a minimally-distributed switch activation pattern, eight switch elements are activated within two diagonally disposed subarrays (subarrays 0 and 3 or subarrays 1 and 2 in the FIG. 6 embodiment) while all switch elements in the other two subarrays are rendered inactive (i.e., as in the case of a cell activation pattern that extends diagonally through the switch array as a whole).

Still referring to FIGS. 7 and 8, while pipelined data transfer (i.e., commencing data transfer via one subarray while configuring switched interconnections in another) reduces latency and increases source-to-destination throughput (bandwidth), it may be desirable from a control or timing perspective to configure switched interconnections in all subarrays and then commence switched data transfer simultaneously with respect to the configured subarrays. Conversely, the pipelined data transfer may be carried with finer granularity by commencing data transfer with respect to a given source/destination as soon as their respective signaling links are interconnected (i.e., after each switch cell is activated), in effect time-staggering each individual source/destination data flow through the switch. This time-staggered/pipelined operation may be implemented within the dual-indexed (row/column-indexed) embodiment of FIGS. 4 and 5 as well.

FIG. 9 illustrates embodiments of signal driver/receiver circuitry that may be used to implement the control/select signal drivers (171, 207, 209, 289), data signal driver (173) and data signal receiver (175) illustrated in FIGS. 2, 4 and 7. As shown at 331, large-swing control/select signal drivers (shown generally as 171) may be implemented by a CMOS transistor pair (333, 335) coupled in series between a control voltage source and ground to form an inverter—the gate terminals of transistors 333 and 335 coupled in common to form the inverter input and the drain terminals of those same transistors coupled in common to form the inverter output. In this configuration, an active-low logic-level input signal (i.e., swinging between VDD and ground) will yield an active-high select signal (shown as $c_{SEL}[i,j]$, for example) on the driver output that swings between the control voltage (500 mV in this example and thus ~100× the threshold voltage of MOS transistors disposed in the 4K switch) and ground.

A small-swing differential data driver 341 (e.g., implementation of driver 173) is implemented by two pairs of NMOS transistors (341/343 and 345/347) and a pair of AND gates 348 and 349. Constituent "pull-up" and "pull-down" transistors within each transistor pair (i.e., 341 and 343 in one pair, 345 and 347 in the other) are coupled in series between a relatively low data voltage rail (e.g., ~10 mV) and ground, with the common (interconnected) drains of each transistor pair forming a respective one of the differential outputs, $d_{IN}[i]+$ and $d_{IN}[i]-$ (i.e., so labeled from perspective of the recipient switch IC). When enabled by assertion of signal En+, AND gates 348 and 349 generate complementary outputs according to the state of CMOS-logic-level data signal $D_{IN}[i]+$ (i.e., complementary by virtue of inverting input at AND gate 349). The output of AND gate 348 is coupled to the gates of pull-up transistor 341 and pull-down transistor 347 (i.e., one transistor in each series-coupled transistor pair) and the output of AND gate 349 is coupled to the gates of pull-down transistor 343 and pull-up transistor 345. By this arrangement, a logic-high $D_{IN}[i]+$ signal will drive a logic-high output from AND gate 348 (i.e., when En+ is asserted) and a logic-low output from AND gate 349, switching on pull-up transistor 341 and pull-down-transistor 347 (and switching off pull-down transistor 343 and pull-up transistor 345) to yield a +10 mV differential signal across output nodes $d_{IN}[i]±$ to convey the logic '1' data state (while depicted as ~10 mV for explanatory purposes, the $V_{DATA}$ voltage rail may be set at 10 mV $+2V_T$ to yield a ~10 mV differential output). Conversely, a CMOS-logic-low $D_{IN}[i]+$ signal will drive a logic high-output from AND gate 349 and a logic-low output from AND gate 348, switching on pull-up transistor 345 and pull-down-transistor 343 (and switching off pull-down transistor 347 and pull-up transistor 341) to yield a −10 mV differential signal across output nodes $d_{IN}[i]±$ to convey the logic '0' data state. In general, the CMOS voltage rail (i.e., $V_{DD}$, not specifically shown) is set to a potential greater than the threshold voltage of transistors 341, 343, 345 and 347 by at least 10 mV (e.g., 500 mV in an embodiment where driver 341 is intended for operation at 77 K) so that a logic-high output of either AND gate (348 or 349) will yield a gate-to-source voltage sufficient to switch on one of the pull-up transistors (341, 345) and one of the pull-down transistors (343, 347).

Still referring to FIG. 9, differential signal receiver 175 is implemented, in a number of embodiments, by amplifying/sampling circuit 351. As shown, true and complement components of a small-swing (e.g., 10 mV) differential data signal $d_{OUT}[j]±$ are supplied to respective gates of PMOS input-stage transistors 353 and 353, with those transistors coupled in the power-supply paths of back-to-back coupled inverters 357 and 359, respectively (i.e., inverter 357 being formed by transistors 361 and 363, and inverter 359 formed by transistors 365 and 367). Sample-enable transistor 371 (PMOS) is coupled source-to-drain between a CMOS supply rail ($V_{DD}$=500 mV in this example) and the common sources of transistors 361 and 365, and latch-disable transistors 373 and 375 are coupled between ground and respective output nodes, S+ and S− of inverters 357 and 359. The inverter outputs, S+ and S−, are also coupled to inputs of respective NOR gates 381 and 383, the outputs of which are cross-coupled to the second input of the counterpart NOR gate (i.e., output of NOR gate 381 coupled to input of NOR gate 383 and vice-versa) to form a data latch 385. The gates of sample-enable transistor 371 and latch-disable transistors 373 and 375 are coupled in common to receive an active-low sample-enable signal, Ld−.

When sample-enable signal (Ld−) is deasserted (i.e., driven or pulled high), sample-enable transistor 371 is switched off (isolating inverters 357 and 359 from the $V_{DD}$ supply rail) while latch-disable transistors 373 and 375 are switched on to ground the inverter outputs S+ and S− and thus ready latch 385 for a data latching operation. When sample-enable signal Ld− transitions from high to low (i.e., sample-enable signal asserted), sample-enable transistor 371 switches on to establish ~500 mV (less a 77K transistor threshold voltage drop) at the source terminals of input-stage transistors 353 and 355, and the differential input signal $d_{OUT}[j]\pm$ (so named from perspective of a remote switch IC) will cause one of those input-stage transistors to switch on more strongly than the other (i.e., the lower-potential one of the true and complement components of $d_{OUT}[j]\pm$ will result in greater current conduction through the corresponding one of transistors 353 and 355), thereby powering up the corresponding one of inverters 357 and 359 more quickly than the other. The first-to-power of inverters 357 and 359 will drive a logic high output in response to the pre-charged low input (i.e., the logic low established by the grounding of the inverter inputs/outputs prior to the low-going transition of Ld−), thereby reinforcing the logic low output of the other of inverters 357/359 by virtue of the back-to-back inverter coupling (i.e., input of inverter 357 coupled to output of inverter 359 and vice-versa). Thus, the S+/S− outputs of inverters 357 and 359 will snap to one of two bi-stable states—S+ high and S− low or vice-versa—according to the polarity of the ~10 mV differential conveyed in data signal $d_{OUT}[j]\pm$. Whichever of the inverter outputs goes high, S+ or S−, will drive a low output from the corresponding NOR gate (381 or 383) within latch 385, with that high NOR gate output being fed back to the counterpart NOR gate to drive a low output therefrom, latching a CMOS-level differential data signal $D_{OUT}[j]\pm$ at the amplifying/sampler output. Altogether a logic '1' conveyed in $d_{OUT}[j]\pm$ (i.e., $d_{OUT}[j]+=\sim10$ mV, $d_{OUT}[j]-=\sim0v$) will power inverter 359 more rapidly than inverter 357, driving S+ high and S-low and thus latching $D_{OUT}[j]+$ high and $D_{OUT}[j]-$low to produce a logic '1' data sample at $D_{OUT}[j]\pm$. Conversely, a logic '0' conveyed in $d_{OUT}[j]\pm$ will power inverter 357 more rapidly than inverter 359, driving S-high and S+ low and thus latching $D_{OUT}[j]+$ low and $D_{OUT}[j]-$high to produce a logic '0' data sample.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, temperatures, temperature ranges, supply voltages, threshold voltages, transistor types, numbers of bits, signal path widths, signaling or operating frequencies and the like can be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated-circuit die comprising:
    control signal contacts to receive respective control signals from a control-signal source external to the integrated-circuit die;
    data input contacts to receive inbound data signals from one or more data-signal sources external to the integrated-circuit die;
    data output contacts to convey outbound data signals to one or more data-signal destinations external to the integrated circuit die; and
    an array of switch cells that (i) is coupled between the data input contacts and the data output contacts, (ii) is coupled directly to the control signal contacts to receive the control signals and (iii) switchably couples the data input contacts to selected ones of the data output contacts according to the control signals;
    wherein the array of switch cells comprises switch cells arranged in N rows and M columns, where N and M are integers that may be equal or unequal, and wherein the control signal contacts comprise a quantity of contacts corresponding to a sum of M and N.

2. The integrated-circuit die of claim 1 wherein the sum of M and N matches a sum of respective quantities of the data input contacts and the data output contacts.

3. The integrated-circuit die of claim 1 wherein the array of switch cells comprises a plurality of sub-arrays each constituted by a plurality of switch cells, and wherein the control signal contacts comprise one contact for each of the sub-arrays and additional contacts according to a quantity of the switch cells that constitute one of the sub-arrays.

4. The integrated-circuit die of claim 3 wherein the array of switch cells comprises a predetermined number Q of switch cells, and wherein the control signal contacts comprise a number of contacts fewer than twice the square-root of Q.

5. An intergrated-circuit die comprising;
control signal contacts to receive respective control signals from a control-signal source external to the intergrated-circuit die;
data input contacts to receive respective control signals from a control-signal sources external to the intergrated-circuit die;
data output contacts to convey outbound data signals to one or ore data-signal destinations external to the intergrated-circuit die; and
an array of switch cells that (i) is coupled between the data input contacts and the data output contacts, (ii) is coupled directly to the control signal contacts to receive the control signals and (iii) switchably couples the data input contacts to selected ones of the data output contacts according to the control signals;
wherein the control signal contacts to receive respective control signals comprise row-select contacts to receive respective row-select signals and column-select contacts to receive respective column-select signals, and wherein a first switch cell within the array of switch cells comprises:
  a first field-effect transistor coupled drain-to-source between one of the data output contacts and one of the data input contacts; and
  a second field-effect transistor coupled drain-to-source between (i) a gate terminal of the first field-effect transistor and (ii) one of the row-select contacts or one of the column-select contacts, the second field-effect effect transistor having a gate terminal coupled to whichever of the one of the row-select contacts or the one of the column-select contacts is not otherwise coupled to the second field-effect transistor.

6. A method of operation within an integrated-circuit die, the method comprising:
receiving control signals from a control-signal source external to the integrated-circuit die;
conducting the control signals directly to an array of switch cells to configure the array of switch cells to switchably interconnect a plurality of inbound data contacts to a plurality of outbound data contacts; and
after configuring the array of switch cells, receiving, at the plurality of inbound data contacts from one or more external data-signal sources, inbound data signals that propagate through the array of switch cells to the plurality of outbound data contacts for conveyance to external data-signal destinations;
wherein the array of switch cells comprises a plurality of sub-array each constituted by a plurality of switch cells, and wherein receiving control signals comprises receiving (i) a respective sub-array-select signal for each of the plurality of sub-arrays, rceiving row-select signals for each row of switch cells within one of the subarrays and receiving column-select signals for each column of switch cells within the one of the sub-arrays.

7. The method of claim 6 wherein conducting the control signals directly to the array of switch cells to configure the array of switch cells comprises switchably interconnecting the plurality of inbound data contacts to the plurality of outbound data contacts during a first interval, and wherein receiving inbound data signals that propagate through the array of switch cells to the plurality of outbound data contacts comprises conducting the inbound data signals through the array of switch cells during a second interval that transpires after the first interval.

8. A method of operation within an intergrated-circuit die, the method comprising:
receiving control signals from a control-signal source external to the integrated-circuit die;
conducting the control signals directly to an array of switch cells to configure the array of switch cells to switchably interconnect a plurality of inbound data contacts to a plurality of outbound data contacts; and
after configuring the array of switch cells, receiving, at the plurality of inbound data contacts from one or more external data-signal sources, inbound data signals that propagate through the array of switch cells to the plurality of outbound data contacts for conveyance to the external data-signal destinations;
wherein the integrated-circuit die is disposed in a first temperature domain sufficiently cold to enable superconduction.

9. The method of claim 8 wherein receiving control signals from the control-signal source external to the integrated-circuit die comprises receiving the control signals from a control-signal-source disposed in a second temperature domain substantially warmer than the first temperature domain.

10. The method of claim 8 wherein receiving, from one or more external data-signal sources, inbound data signals that propagate through the array of switch cells to the plurality of outbound data contacts for conveyance to external data-signal destinations comprises receiving, from at least one external data-signal source disposed in a second temperature domain substantially warmer than the first temperature domain, an inbound data signal that propagates through the array of switch cells to an outbound data contact for conveyance to an external data-signal destination disposed in the second temperature domain.

11. The method of claim 6 wherein receiving control signals from the control-signal source external to the integrated-circuit die comprises receiving a first control signal having one of two signal levels that differ by a first voltage, and wherein receiving inbound data signals comprises receiving a first inbound data signal having one of two signal levels that differ by a second voltage, the first voltage being significantly higher than the second voltage.

* * * * *